(12) United States Patent
Matsuo

(10) Patent No.: US 10,892,734 B2
(45) Date of Patent: Jan. 12, 2021

(54) RESONATOR ELEMENT, RESONATOR, OSCILLATOR, ELECTRONIC DEVICE, AND VEHICLE

(71) Applicant: SEIKO EPSON CORPORATION, Tokyo (JP)

(72) Inventor: Atsushi Matsuo, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 67 days.

(21) Appl. No.: 16/279,059

(22) Filed: Feb. 19, 2019

(65) Prior Publication Data

US 2019/0260352 A1     Aug. 22, 2019

(30) Foreign Application Priority Data

Feb. 20, 2018 (JP) ................................. 2018-027634

(51) Int. Cl.
| | |
|---|---|
| *H03H 9/19* | (2006.01) |
| *H03H 9/13* | (2006.01) |
| *H03H 9/10* | (2006.01) |
| *H03B 5/32* | (2006.01) |

(52) U.S. Cl.
CPC ............. *H03H 9/13* (2013.01); *H03B 5/32* (2013.01); *H03H 9/10* (2013.01); *H03H 9/19* (2013.01)

(58) Field of Classification Search
CPC .. H03H 9/10; H03H 9/13; H03H 9/17; H03H 9/19
See application file for complete search history.

(56) References Cited

U.S. PATENT DOCUMENTS

| | | | |
|---|---|---|---|
| 2008/0036335 A1* | 2/2008 | Naito ...................... | H03H 3/04 310/361 |
| 2014/0175944 A1 | 6/2014 | Koyama et al. | |
| 2015/0229291 A1* | 8/2015 | Lim ........................ | H03H 9/19 310/321 |
| 2019/0123714 A1* | 4/2019 | Kizu .................... | H03H 9/0595 |

FOREIGN PATENT DOCUMENTS

| | | | | |
|---|---|---|---|---|
| JP | 54083793 A | * | 7/1979 | ............. H03H 9/177 |
| JP | 56107617 A | * | 8/1981 | ............. H03H 9/177 |
| JP | 2014-127743 A | | 7/2014 | |
| JP | 2014-192712 A | | 10/2014 | |
| JP | 2016-127594 A | | 7/2016 | |

* cited by examiner

*Primary Examiner* — J. San Martin
(74) *Attorney, Agent, or Firm* — Oliff PLC

(57) ABSTRACT

A resonator element includes a first electrode that is installed on a resonance portion of one of main surfaces positioned on the front and rear surfaces of a substrate, and a second electrode that is installed on the resonance portion of the other of the main surfaces, an outer shape of the substrate includes a first side surface and a second side surface, are arranged in a second direction intersecting the first direction, the first side surface and the second side surface respectively include an inclined surface, the first electrode includes a first lead electrode installed on the inclined surface of the first side surface, a second electrode includes the second lead electrode installed on the inclined surface of the second side surface, and an angle formed between the inclined surface and the main surface is equal to or greater than 52° and equal to or less than 62°.

14 Claims, 9 Drawing Sheets

RESONATOR ELEMENT, RESONATOR, OSCILLATOR, ELECTRONIC DEVICE, AND VEHICLE

BACKGROUND

1. Technical Field

The present invention relates to a resonator element, a resonator, an oscillator, an electronic device, and a vehicle.

2. Related Art

For example, by using piezoelectric effect of a piezoelectric body such as a quartz crystal, a resonator device in which a resonator element that resonates to displace the front and back main surfaces of the resonator element in opposite directions each other, that is, generates a so-called thickness shear vibration, is accommodated in a package, is known. Since such a resonator element resonates such that the main surface on the front and back surfaces are displaced, it is known that when a wire other than an excitation electrode for excitation, for example, a lead electrode or the like connecting between an excitation electrode and an external connection terminal, or the like, is provided on the main surface of a portion close to a resonance area and in which the confinement of the resonance is insufficient, it acts as a hindrance to the resonance and deteriorates resonance characteristics such as reduction of a Q value. Particularly, as a resonator element is downsized, the influence becomes remarkable, and, for example, in JP-A-2014-192712, there is described the resonator element having a configuration in which the lead electrode is provided on a side surface that connects front and back main surfaces approximately perpendicularly and the excitation electrode on the main surface is connected to the external connection terminal via the lead electrode installed on the side surface.

However, in a resonator element described in JP-A-2014-192712, since a side surface on which a lead electrode is provided, is provided substantially perpendicular to the main surface on front and rear surfaces, there is a possibility that the lead electrode passing through a corner portion is damaged by the sharpness of the corner portion where the main surface and the side surface intersect, and disconnection of the lead electrode occurs.

SUMMARY

According to an aspect of a resonator element according to the invention includes a substrate including a resonance portion that excites thickness shear vibration as main resonance, a first electrode that is installed on the resonance portion of one of main surfaces, in both of the main surfaces positioned on front and rear surfaces of the substrate, and a second electrode that is installed on the resonance portion of the other of the main surfaces, in which an outer shape of the substrate in a plan view includes a first side surface and a second side surface that extend in a first direction along a direction of the thickness shear vibration, are arranged in a second direction intersecting the first direction, and are respectively connected to the both main surfaces, the first side surface and the second side surface respectively include an inclined surface inclined with respect to the main surface of the substrate, a first lead electrode connected to the first electrode is installed on the inclined surface of the first side surface, a second lead electrode connected to the second electrode is installed on the inclined surface of the second side surface, and an angle formed between the inclined surface and the main surface is equal to or greater than 52° and equal to or less than 62°.

In the aspect of the resonator element, the first lead electrode may include a first portion installed from the first electrode toward the inclined surface and a second portion installed on the inclined surface, and the second portion may satisfy a relationship of w2>w1 when a width of a portion installed on the main surface is w1 and a width of a portion installed on the inclined surface is w2.

In the aspect of the resonator element, the second lead electrode may include a first portion installed from the second electrode toward the inclined surface and a second portion installed on the inclined surface, and the second portion may satisfy a relationship of w4>w3 when a width of a portion installed on the main surface is w3 and a width of a portion installed on the inclined surface is w4.

In the aspect of the resonator element, the second portion of the first lead electrode and the second portion of the second lead electrode may be installed on only the inclined surfaces.

An aspect of a resonator according to the invention may include the resonator element according to any one of the aspects described above, a package that has a concave portion and in which the resonator element is accommodated in the concave portion, and a lid that seals the concave portion.

An aspect of an oscillator according to the invention may include the resonator element according to any one of the aspects described above, a circuit element that includes an electric circuit for driving the resonator element, a package that has a concave portion and in which the resonator element and the circuit element are accommodated in the concave portion, and a lid that seals the concave portion.

An aspect of an electronic device according to the invention may include the resonator element according to any one of the aspects described above, and a controller that performs a control based on a resonance signal of the resonator element.

An aspect of a vehicle according to the invention may include the resonator element according to any one of the aspects described above, and a controller that performs a control based on a resonance signal of the resonator element.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of a resonator element, a resonator, an oscillator, an electronic device, and a vehicle according to the invention will be described with reference to the accompanying drawings.

Resonator Element

First Embodiment of Resonator Element

Figure 1:
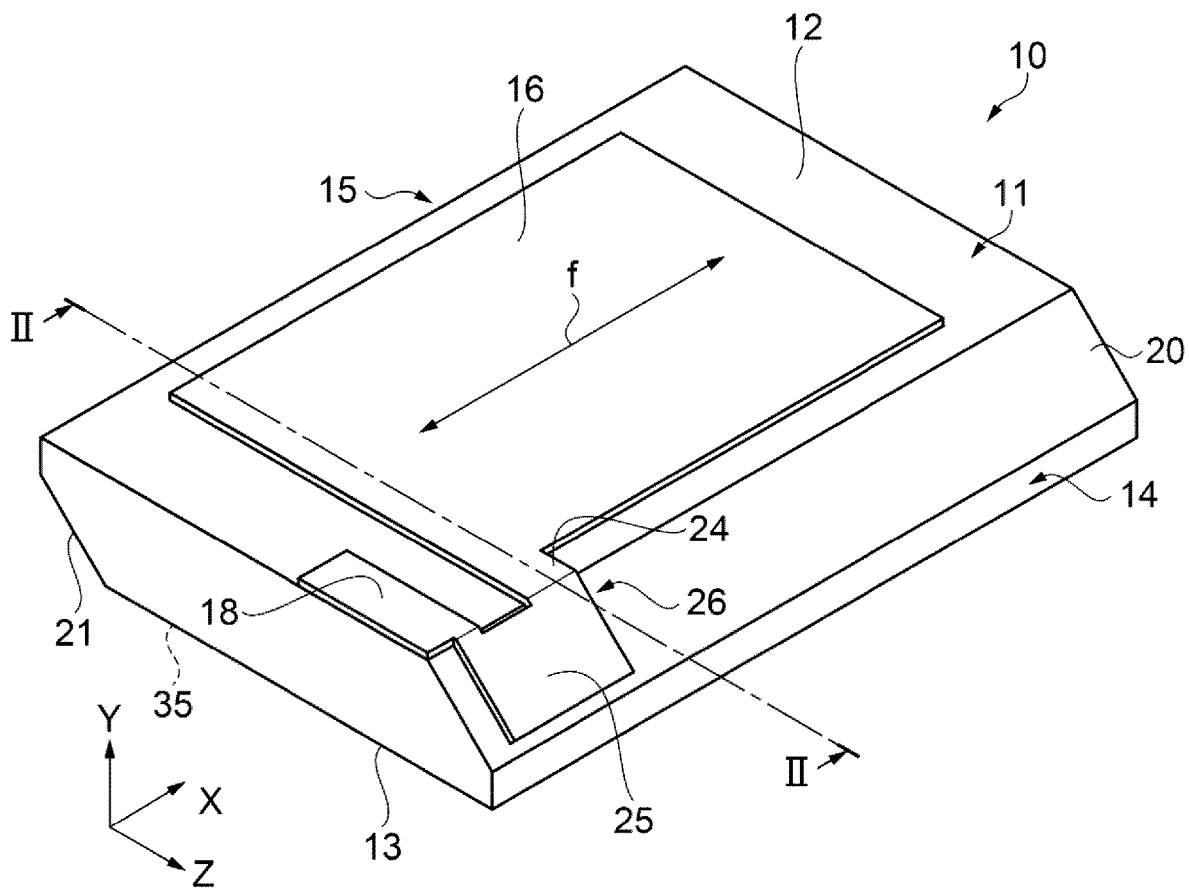
FIG. 1 is a perspective view illustrating an outline of a resonator element according to a first embodiment.
Figure 2:
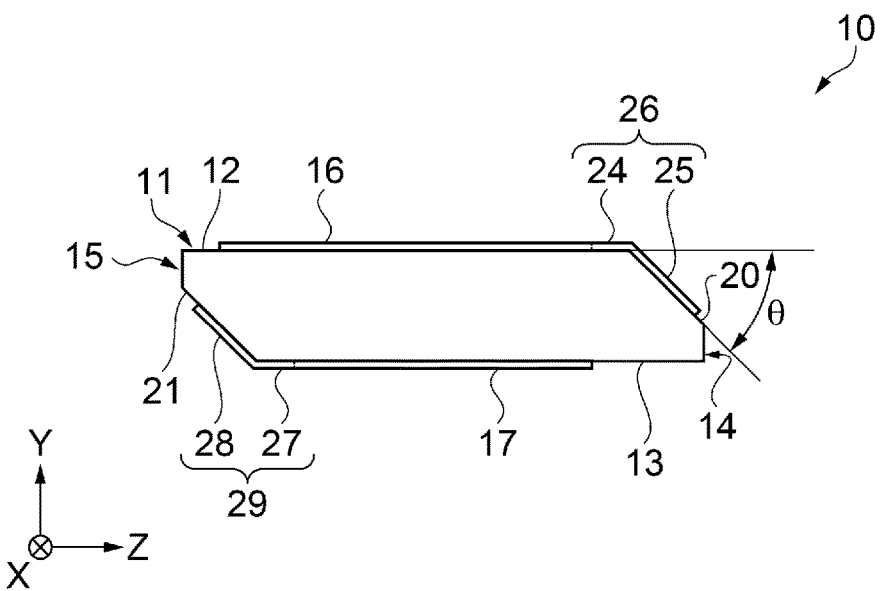
FIG. 2 is a sectional view taken along line II-II of FIG. 1 illustrating the outline the resonator element according to the first embodiment.
Figure 3:
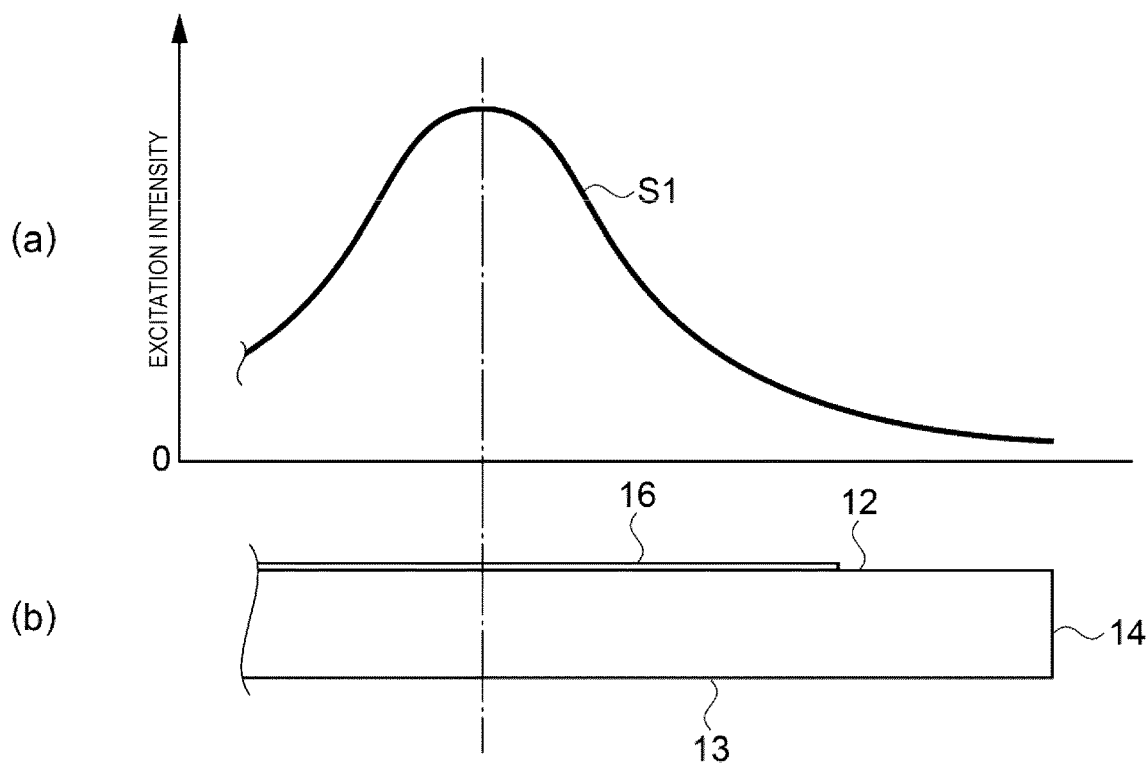
FIG. 3 illustrates explanatory diagrams illustrating excitation intensity of a resonator element in the related art as a comparison example.
Figure 4:
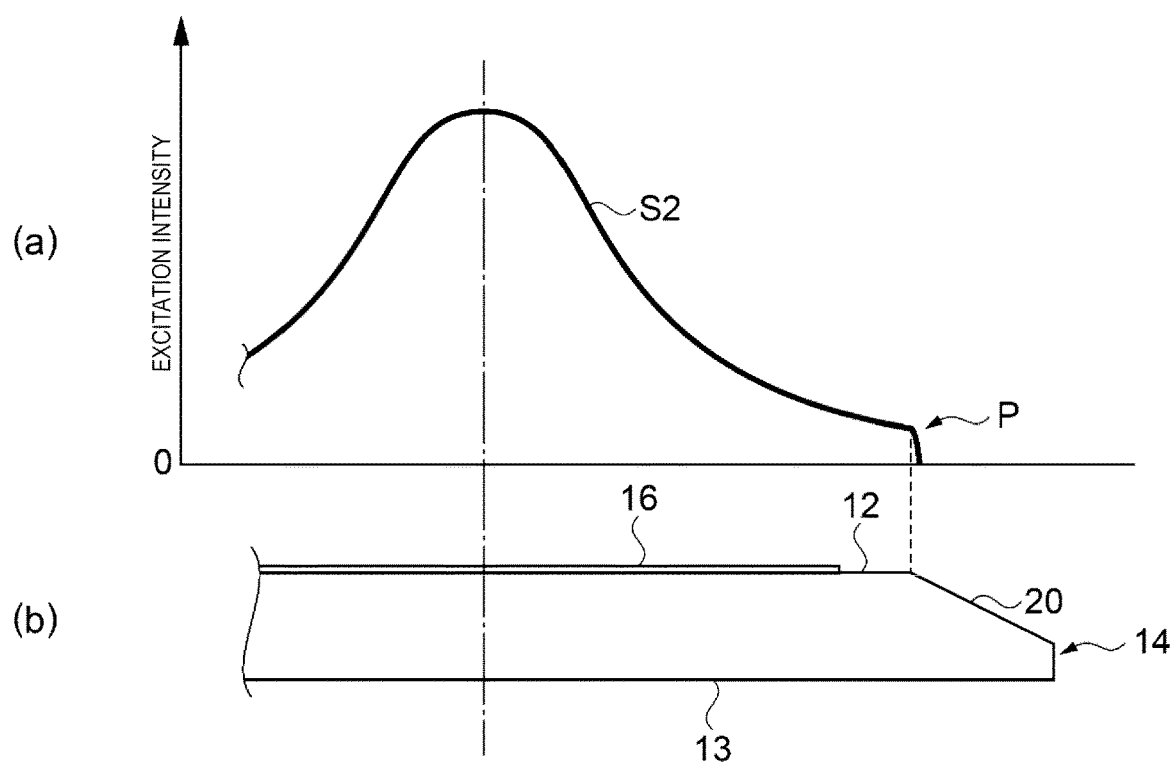
FIG. 4 illustrates explanatory diagrams illustrating the excitation intensity of the resonator element according to the first embodiment.

With reference to FIG. 1, FIG. 2, FIG. 3, and FIG. 4, a resonator element according to a first embodiment will be described. FIG. 1 and FIG. 2 illustrate outlines of the resonator element according to the first embodiment of the invention, FIG. 1 is a perspective view, and FIG. 2 is a sectional view taken along line II-II of FIG. 1. FIG. 3 illustrates explanatory diagrams illustrating excitation intensity of a resonator element in the related art as a comparison example. FIG. 4 illustrates explanatory diagrams illustrating the excitation intensity of the resonator element according to the first embodiment.

As a resonator element 10 according to the first embodiment, an AT-cut quartz crystal substrate (piezoelectric substrate) formed with a quartz crystal as an example of a piezoelectric material, is used. Although it is not illustrated, the piezoelectric material such as a quartz crystal belongs to a trigonal system and has crystal axes X, Y, and Z orthogonal to each other. The X axis, the Y axis, and the Z axis are referred to as an electric axis, a mechanical axis, and an optical axis, respectively. Accordingly, the quartz crystal substrate is used as a flat plate cut from the quartz crystal along a plane obtained by rotating an XZ plane around the X-axis by a predetermined angle θ. For example, in a case of the AT-cut quartz crystal substrate, θ is approximately 35° 15'. The Y-axis and the Z-axis also rotate by rotating around the X axis by θ to be a Y' axis and a Z' axis, respectively. Therefore, the AT-cut quartz crystal substrate has orthogonal crystal axes X, Y', and Z'. In the AT-cut quartz crystal substrate, a thickness direction is the Y' axis, XZ' plane (plane including X axis and Z' axis) orthogonal to the Y' axis is the main surface, and the thickness hear vibration is excited as the main resonance in a direction of an arrow f illustrated in FIG. 1, along an X-axis direction. By processing this AT-cut quartz crystal substrate, it is possible to obtain the piezoelectric substrate as a raw plate of the resonator element 10. That is, the piezoelectric substrate as the raw plate of the resonator element 10 is configured with a plane in parallel with the X axis and the Z' axis in which an axis inclined in a –Y direction of the Y axis is the Z' axis in the Z axis and an axis inclined in a +Z direction of the Z axis is the Y' axis in the Y-axis, and the AT-cut quartz crystal substrate having a thickness in a direction parallel to the Y' axis, with the X-axis of an orthogonal coordinate system consisting of the X-axis (electric axis), the Y-axis (mechanical axis), and the Z-axis (optical axis) as the center. In the drawings referred to below, the Y' axis is described as the Y axis and the Z' axis is described as the Z axis, for the convenience of explanation. In addition, the X-axis direction along a direction of the thickness shear vibration is described as a first direction and a Z-axis direction intersecting the first direction is described as a second direction.

The resonator element 10 of the present embodiment is the above-described quartz crystal as an example of the piezoelectric material, includes a long side along the X-axis direction (first direction) and a short side along the Z-axis direction (second direction), and uses the piezoelectric substrate formed in a rectangular shape in a plan view from the Y-axis, as a substrate 11. The resonator element 10 of the present embodiment uses the AT-cut quartz crystal substrate as the piezoelectric substrate. The substrate 11 includes a main surface 12 of the front side and a main surface 13 of the rear side opposite to each other along a Y-axis direction. Furthermore, the substrate 11 includes a first side surface 14 and a second side surface 15 which extend in the X-axis direction, are arranged opposite to each other in the Z-axis direction, and connect both main surfaces 12 and 13. The first side surface 14 includes an inclined surface 20 that intersect by being inclined in an angle θ which is in a range of 57°±5°, that is, equal to or greater than 52° and equal to or less than 62°, with respect to the main surface 12 of the front side. That is, the vertex angle at which the main surface 12 and the first side surface 14 intersect, is in a range of 123°±5°, that is, equal to or greater than 118° and equal to or less than 128°. In addition, the second side surface 15 includes an inclined surface 21 that intersect by being inclined in an angle θ which is in a range 57°±5°, that is, equal to or greater than 52° and equal to or less than 62°, with respect to the main surface 13 of the rear side. That is, the vertex angle at which the main surface 13 and the second side surface 15 intersect is in a range of 123°±5°, that is, equal to or greater than 118° and equal to or less than 128°. In other words, the inclined surface 20 and the inclined surface 21 provided on the first side surface 14 and the second side surface 15 are provided to have an approximately 180° symmetrical structure with respect to the X-axis. Therefore, an intersecting corner portion between the first side surface 14 and the main surface 12 of the front side, and an intersecting corner portion between the second side surface 15 and the main surface 13 of the rear side are obtuse angles of equal to or greater than 118° and equal to or less than 128°, respectively. Although not numbered, the resonator elements 10 are arranged to be opposed to each other in the X-axis direction, and also has two side surfaces on the short side connecting both main surfaces 12 and 13.

On the main surface 12 of the front side of the substrate 11, a first electrode 16 disposed by corresponding to a resonance portion positioned at the center portion in a plan view from the Y-axis direction and an external connection electrode 18 disposed at an end portion in the X-axis direction are provided. In addition, on the main surface 13 of the rear side of the substrate 11, a second electrode 17 positioned at a position opposite to the first electrode 16 which corresponds to the resonance portion positioned at the center portion in the plan view from the Y-axis direction and an external connection electrode 35 disposed at an end portion in the X-axis direction are provided.

On the inclined surface 20 of the first side surface 14, a first lead electrode 26 connected to the first electrode 16 is installed. The first lead electrode 26 includes a first portion 24 installed from the first electrode 16 toward the inclined surface 20 and a second portion 25 installed on the inclined surface 20, and is connected to the external connection electrode 18 via the second portion 25. In other words, the first electrode 16 is connected to external connection electrode 18 via the first lead electrode 26.

On the inclined surface 21 of the second side surface 15, a second lead electrode 29 connected to the second electrode 17 is installed. Similar to the first lead electrode 26, the second lead electrode 29 includes a first portion 27 installed from the second electrode 17 toward the inclined surface 21 and a second portion 28 installed on the inclined surface 21, and is connected to the external connection electrode 35 via the second portion 28. In other words, the second electrode 17 is connected to the external connection electrode 35 via the second lead electrode 29. Although it is not illustrated in FIG. 1, the second lead electrode 29 is formed with the same shape as that of the first lead electrode 26 in a plan view from a direction toward the inclined surface 21.

Since the resonator element 10 includes the inclined surface 20 inclined at an angle θ of equal to or greater than 52° and equal to or less than 62° to the first side surface 14 configuring the substrate 11, and intersecting the first side surface 14, an intersecting corner portion between the inclined surface 20 and the main surface 12 has an obtuse angle of equal to or greater than 118° and equal to or less than 128°, and it is possible to hardly cause damage on the first lead electrode 26 passing through this corner portion. Therefore, it is possible to hardly cause disconnection due to the corner portion of the first lead electrode 26. In addition, similarly, since the resonator element 10 includes the inclined surface 21 inclined at the angle θ of equal to or greater than 52° and equal to or less than 62° to the second side surface 15 configuring the substrate 11 and intersecting the second side surface 15, an intersecting corner portion between the inclined surface 21 and the main surface 13 has an obtuse angle of equal to or greater than 118° and equal to or less than 128°, and it is possible to hardly cause damage on the second lead electrode 29 passing through this corner portion. Therefore, it is possible to hardly cause disconnection due to the corner portion of the second lead electrode 29.

In addition, on each of the first side surface 14 and the second side surface 15, by providing the inclined surfaces 20 and 21 at an angle between the main surfaces 12 and 13 having equal to or greater than 52° and equal to or less than 62°, it is possible to strengthen resonance confining effect on a first side surface 14 side and a second side surface 15 side. This will be described with reference to FIG. 3 and FIG. 4.

As illustrated in (b) in FIG. 3, in a configuration in the related art in which the inclined surfaces 20 and 21 are not provided on the first side surface 14 and the second side surface 15, as described in (a) in FIG. 3, resonance confinement on the first side surface 14 side and the second side surface 15 side is insufficient and the resonance (excitation intensity) remains on the first side surface 14 and the second side surface 15. On the other hand, as illustrated in (b) in FIG. 4, in a configuration of the present embodiment in which the inclined surfaces 20 and 21 are provided on the first side surface 14 and the second side surface 15, as illustrated in (a) in FIG. 4, the resonance in a portion in which the inclined surfaces 20 and 21 are provided, is confined and no resonance (excitation intensity) remains.

As described above, on each of the first side surface 14 and the second side surface 15, the inclined surfaces 20 and 21 inclined at an angle of equal to or greater than 52° and equal to or less than 62° between the main surfaces 12 and 13, is provided such that it is possible to strengthen the resonance confinement effect on the first side surface 14 side and the second side surface 15 side. Therefore, even in a case where the first lead electrode 26 and the second lead electrode 29 are provided on the inclined surfaces 20 and 21 positioned at the first side surface 14 side and the second side surface 15 side, it is possible to reduce influence on the resonance characteristics due to this installation, it is possible to improve the resonance characteristics, for example, a Q value, a CI value (crystal impedance), or the like.

In addition, as described above, the second portion 25 of the first lead electrode 26 and the second portion 28 of the second lead electrode 29 are installed on only the inclined surfaces 20 and 21 without being installed on the main surfaces 12 and 13. With this configuration, by providing only the first portions 24 and 27 on the main surfaces 12 and 13 of a portion close to a resonance area (arrangement area of first electrode 16 and second electrode 17), it is possible to further reduce the influence due to the first lead electrode 26 and the second lead electrode 29 with respect to the resonance characteristics.

Second Embodiment of Resonator Element

Figure 5:
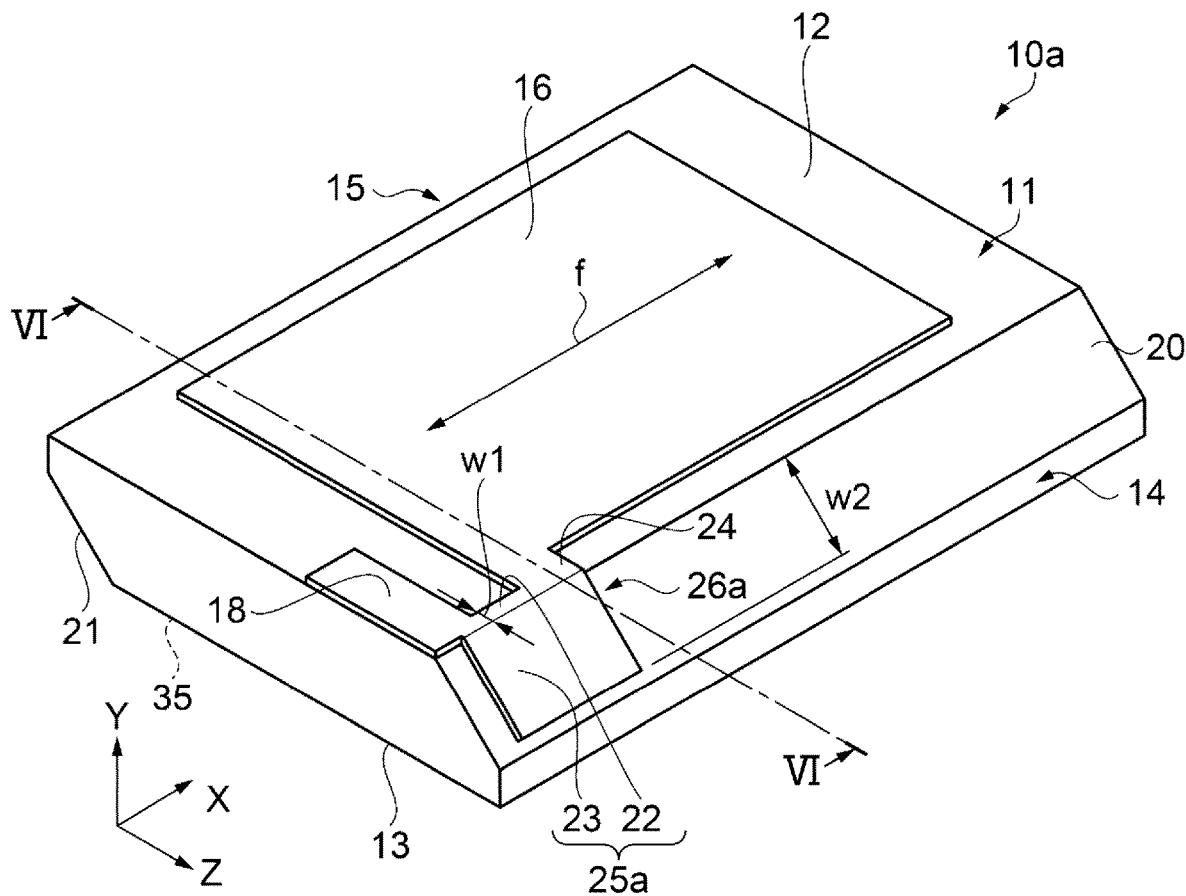
FIG. 5 is a perspective view illustrating an outline of a resonator element according to a second embodiment.
Figure 6:
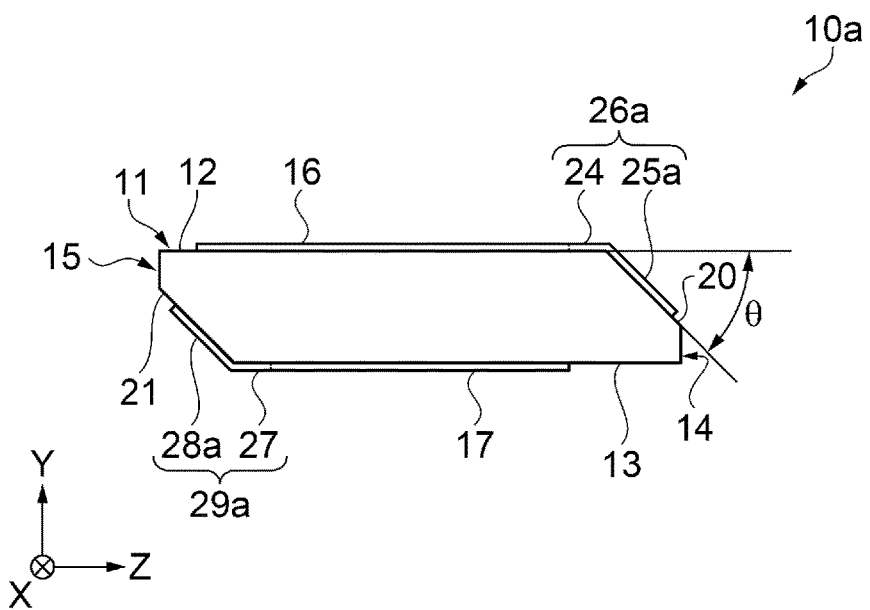
FIG. 6 is a sectional view taken along line VI-VI of FIG. 5 illustrating the outline of the resonator element according to the second embodiment.
Figure 7:
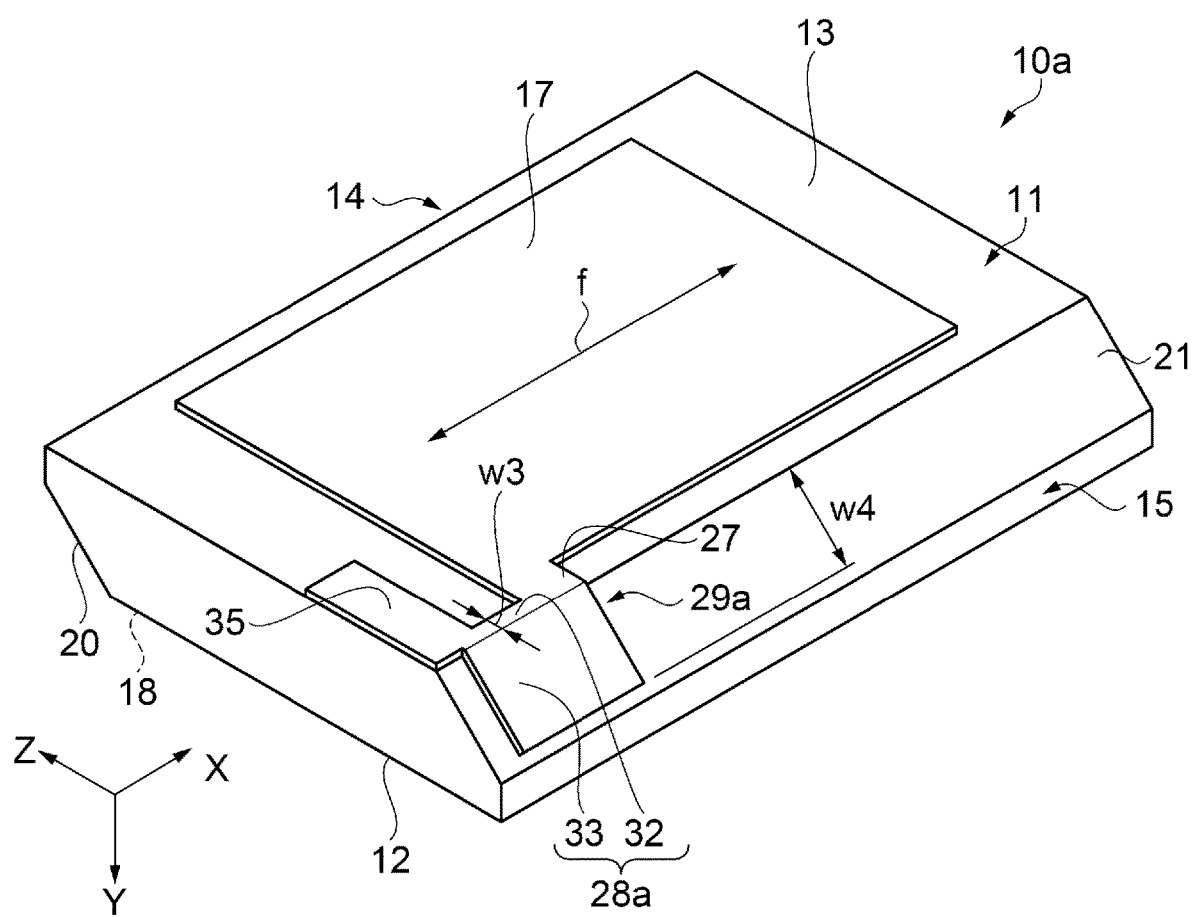
FIG. 7 is a perspective view from the rear side opposite to FIG. 5 of the resonator element according to the second embodiment.

With reference to FIG. 5, FIG. 6, and FIG. 7, a resonator element according to a second embodiment will be described. FIG. 5 and FIG. 6 illustrate outlines of the resonator element according to the second embodiment, FIG. 5 is a perspective view, FIG. 6 is a sectional view taken from line VI-VI of FIG. 5. FIG. 7 is a perspective view from the rear side of an opposite side to the resonator element in FIG. 5 according to the second embodiment.

On a resonator element 10a according to the second embodiment, similar to the first embodiment, by the quartz crystal substrate described above as an example of the piezoelectric material, the AT-cut quartz crystal substrate (piezoelectric substrate) formed in the rectangular shape in a plan view from the Y-axis direction, which has a long side along the X-axis direction and a short side along the Z-axis direction, is used as the substrate 11. In the drawings referred to below, for the convenience of explanation, the Y' axis is described as the Y-axis, and the Z' axis is described as the Z axis. In addition, the X-axis direction along the direction of the thickness shear vibration is referred to as the first direction and the Z-axis direction intersecting the first direction is referred to as the second direction.

Similar to the first embodiment, the substrate 11 configuring the resonator element 10a of the present embodiment includes the main surface 12 of the front side and the main surface 13 of the rear side to be opposed to each other along the Y-axis direction. Furthermore, the substrate 11 includes the first side surface 14 and the second side surface 15 that extend in the X-axis direction (first direction), are arranged to be opposed to each other in the Z-axis direction (second direction), and connect both main surfaces 12 and 13. The first side surface 14 includes the inclined surface 20 inclined at the angle θ of equal to or greater than 52° and equal to or less than 62° with respect to the main surface 12 of the front side, and intersecting the main surface 12. In addition, the second side surface 15 includes the inclined surface 21 inclined at an angle θ of equal to or greater than 52° and equal to or less than 62° with respect to the main surface 13 of the rear side, and intersecting the main surface 13. In other words, the inclined surface 20 and the inclined surface 21 provided on the first side surface 14 and the second side surface 15 are provided to have the approximately 180° symmetrical structure with respect to the X-axis. Therefore, the intersecting corner portion between the first side surface 14 and the main surface 12 of the front side, and the intersecting corner portion between the second side surface 15 and the main surface 13 of the rear side are obtuse angles (equal to or greater than 118° and equal to or less than 128°). Although not numbered, two side surfaces on the short side, arranged to be opposed to each other in the X-axis direction, and connecting both main surfaces 12 and 13, are also provided.

On the main surface 12 of the front side of the substrate 11, the first electrode 16 installed corresponding to the resonance portion positioned at the center portion in the plan view from the Y-axis direction and the external connection electrode 18 installed on an end portion in the X-axis direction are provided. In addition, on the main surface 13 of the rear side of the substrate 11, the second electrode 17 installed at a position opposite to the first electrode 16 and the external connection electrode 35 (see FIG. 7) installed at an end portion in the X-axis direction are provided, which correspond to the resonance portion positioned at the center portion in the plan view from the Y-axis direction.

On the inclined surface 20 of the first side surface 14, a first lead electrode 26a connected to the first electrode 16 is installed. The first lead electrode 26a includes the first portion 24 installed from the first electrode 16 toward the inclined surface 20 and a second portion 25a installed on the inclined surface 20 and the main surface 12, and is connected to the external connection electrode 18 via the second portion 25a. In other words, the first electrode 16 is connected to the external connection electrode 18 via the first lead electrode 26a.

Here, when a width of a portion 22 installed on the main surface 12 is w1 and a width of a portion 23 installed on the inclined surface 20 is w2, the second portion 25a is installed so as to be a relationship of w2>w1. As described above, since they are installed so as to be the width w1 of the portion 22 installed on the main surface 12 in the second portion 25a of the first lead electrode 26a smaller than the width w2 of the portion 23 installed on the inclined surface 20, even if the first lead electrode 26a (second portion 25a) is installed on the main surface 12 of a portion close to the resonance area (disposition area of first electrode 16), it is possible to reduce the influence on the resonance characteristics due to the first lead electrode 26a.

As illustrated in FIG. 7, on the inclined surface 21 of the second side surface 15, a second lead electrode 29a connected to the second electrode 17 is installed. Similar to the first lead electrode 26a, the second lead electrode 29a includes the first portion 27 installed from the second electrode 17 toward the inclined surface 21 and a second portion 28a installed on the inclined surface 21, and is connected to the external connection electrode 35 via the second portion 28a. In other words, the second electrode 17 is connected to the external connection electrode 35 via the second lead electrode 29a.

Here, when a width of a portion 32 installed on the main surface 13 is w3 and a width of a portion 33 installed on the inclined surface 21 is w4, the second portion 28a is installed so as to be a relationship of w4>w3. As described above, since they are installed so as to be the width w3 of the portion 32 installed on the main surface 13 smaller than the width w4 of the portion 33 installed on the inclined surface 21 in the second portion 28a of the second lead electrode 29a, even if the second lead electrode 29a (second portion 28a) is provided on the main surface 13 of a portion close to the resonance area (disposition area of first electrode 16), it is possible to reduce the influence on the resonance characteristics due to the second lead electrode 29a.

In addition, similar to the first embodiment, since the resonator element 10a according to the second embodiment includes the inclined surface 20 inclined at an angle θ of equal to or greater than 52° and equal to or less than 62° to the first side surface 14 configuring the substrate 11 and intersecting the first side surface 14, the intersecting corner portion between the inclined surface 20 and the main surface 12 is an obtuse angle (equal to or greater than 118° and equal to or less than 128°) and it is possible to hardly cause damage on the first lead electrode 26a passing through this corner portion. Therefore, it is possible to hardly cause disconnection due to the corner portion of the first lead electrode 26a. In addition, similarly, since the resonator element 10a includes the inclined surface 21 inclined at an angle θ of equal to or greater than 52° and equal to or less than 62° to the second side surface 15 configuring the substrate and intersecting the second side surface 15, the intersecting corner portion between the inclined surface 21 and the main surface 13 is an obtuse angle (equal to or greater than 118° and equal to or less than 128°), and it is possible to hardly cause damage on the second lead electrode 29a passing through this corner portion. Therefore, it is possible to hardly cause disconnection due to the corner portion of the second lead electrode 29a. In addition, similar to the first embodiment, it is possible to strengthen the resonance confinement effect of the first side surface 14 side and the second side surface 15 side.

Third Embodiment of Resonator Element

Figure 8:
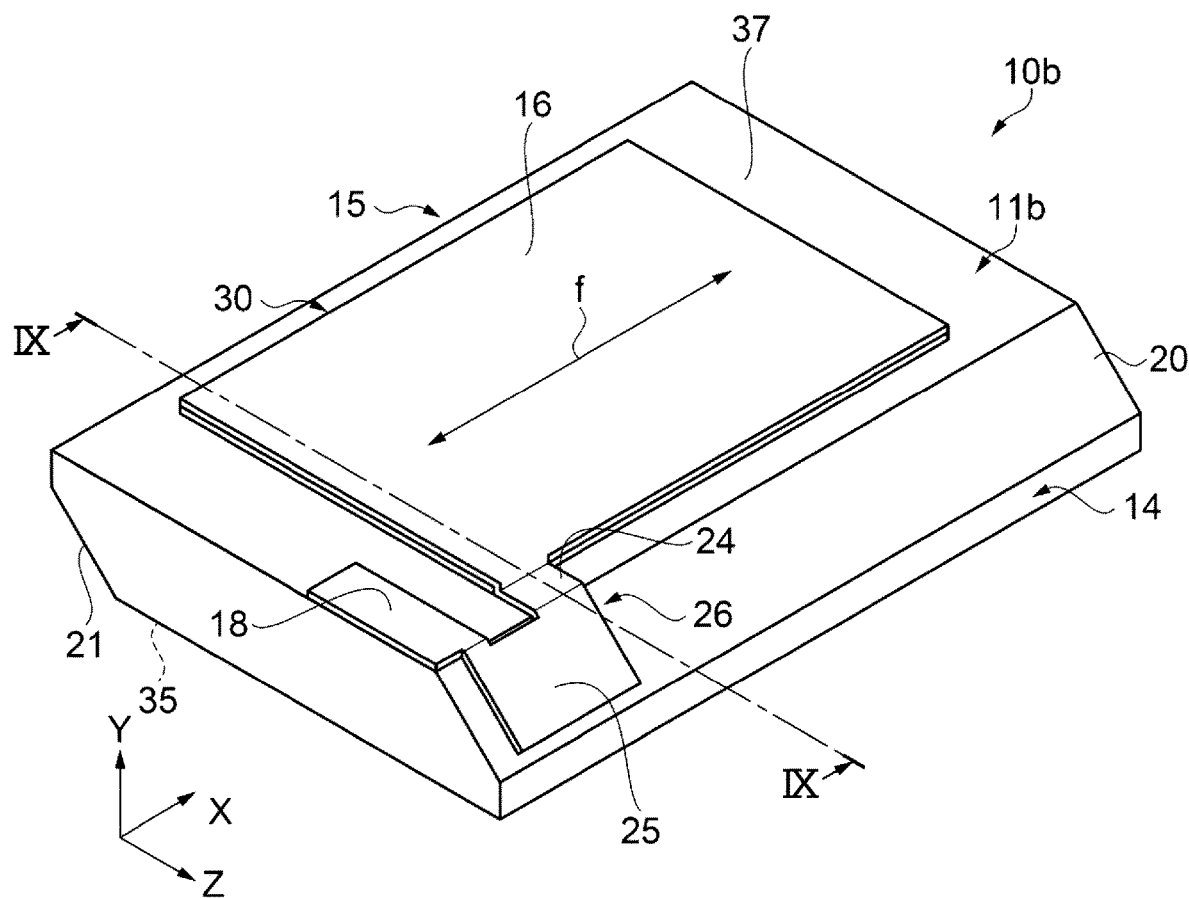
FIG. 8 is a perspective view illustrating an outline of an electro-resonator element according to a third embodiment.
Figure 9:
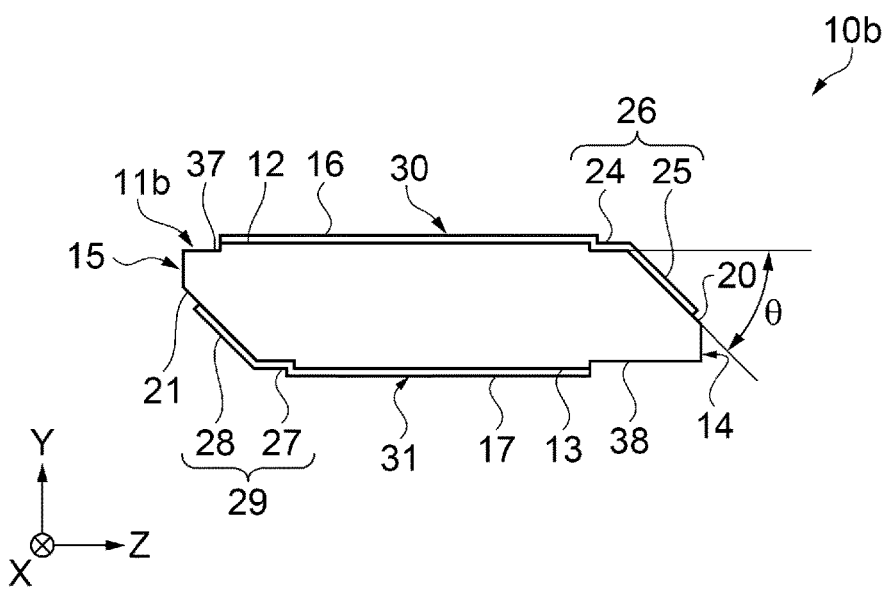
FIG. 9 is a sectional view taken along line IX-IX of FIG. 8 illustrating the outline of the resonator element according to the third embodiment.

With reference to FIG. 8, and FIG. 9, a resonator element according to a third embodiment will be described. FIG. 8 and FIG. 9 illustrate outlines of the resonator element according to the third embodiment, FIG. 8 is a perspective view, and FIG. 9 is a sectional view taken from line IX-IX of FIG. 8.

Similar to the first embodiment, by the above-described quartz crystal substrate as an example of the piezoelectric material, a resonator element 10b according to the third embodiment includes a long side along the X-axis direction and a short side along the Z-axis direction, in a plan view from the Y-axis direction. The AT-cut quartz crystal substrate (piezoelectric substrate) formed in the rectangular shape, is used as a substrate 11b. In the drawings referred to below, for convenience of explanation, the Y' axis is described as the Y axis and the Z' axis is described as the Z axis. In addition, the X-axis direction along the direction of the thickness shear vibration is referred to as the first direction and the Z-axis direction intersecting the first direction is referred to as the second direction.

Similar to the first embodiment, the substrate 11b configuring the resonator element 10b of the present embodiment includes the main surface 12 of the front side and the main surface 13 of the rear side to be opposed to each other along the Y axis direction. In the resonance portion positioned at the center portion in the plan view from the Y-axis direction, a convex portion 30 is provided on a main surface 12 side and a convex portion 31 is provided on a main surface 13 side. In addition, on the substrate 11*b*, a peripheral portion 37 positioned outside the convex portion 30 and a peripheral portion 38 positioned outside the convex portion 31 are provided in a plan view from the Y-axis direction. That is, the substrate 11*b* has a so-called mesa shape configured with the convex portion 30 and the peripheral portion 37 on the main surface 12 side, and has a so-called mesa shape configured with the convex portion 31 and the peripheral portion 38, similarly on the main surface 13 side. Furthermore, the substrate 11*b* includes the first side surface 14 and the second side surface 15 that extend in the X-axis direction (first direction), are arranged to be opposed to each other in the Z-axis direction (second direction), and connect both main surfaces 12 and 13. The first side surface 14 includes the inclined surface 20 inclined in a range that an angle θ is 57°±5°, that is, equal to or greater than 52° and equal to or less than 62° with respect to the main surface 12 of the front side and intersecting the main surface 12. In addition, the second side surface 15 includes the inclined surface 21 inclined in a range that an angle θ is 57°±5°, that is, equal to or greater than 52° and equal to or less than 62° with respect to the main surface 13 of the rear side and intersecting the main surface 13. In other words, the inclined surface 20 and the inclined surface 21 provided on the first side surface 14 and the second side surface 15 are provided to be the approximately 180° symmetrical structure with respect to the X-axis. Therefore, the intersecting corner portion between the first side surface 14 and the main surface 12 of the front side, and the intersecting corner portion between the second side surface 15 and the main surface 13 of the rear side, are obtuse angles (equal to or greater than 118° and equal to or less than 128°). Although not numbered, two side surfaces on the short side, arranged to be opposed to each other in the X-axis direction, and connecting both main surfaces 12 and 13, are also provided.

On the main surface 12 of the front side of the substrate 11*b*, the resonance portion positioned at the center portion in the plan view from the Y-axis direction, that is, the first electrode 16 installed corresponding to the convex portion 30 and the external connection electrode 18 installed at an end portion of the X-axis direction are provided. In addition, on the main surface 13 of the rear side of the substrate 11*b*, the second electrode 17 installed at a position opposite to the first electrode 16 and the external connection electrode 35 installed at an end portion of the X-axis direction, corresponding to the resonance portion positioned at the center portion in the plan view from the Y-axis direction, that is, the convex portion 31, are provided.

On the inclined surface 20 of the first side surface 14, the first lead electrode 26 connected to the first electrode 16 is installed. The first lead electrode 26 includes the first portion 24 installed on the peripheral portion 37 from the first electrode 16 toward the inclined surface 20 and the second portion 25 installed on the inclined surface 20, and is connected to the external connection electrode 18 via the second portion 25. In other words, the first electrode 16 is connected to the external connection electrode 18 via the first lead electrode 26.

On the inclined surface 21 of the second side surface 15, the second lead electrode 29 connected to the second electrode 17 is installed. Similar to the first lead electrode 26, the second lead electrode 29 includes the first portion 27 installed on the peripheral portion 38 from the second electrode 17 toward the inclined surface 21 and the second portion 28 installed on the inclined surface 21, and is connected to the external connection electrode 35 via the second portion 28. In other words, the second electrode 17 is connected to the external connection electrode 35 via the second lead electrode 29. Although not illustrated, the second lead electrode 29 has the same shape as the first lead electrode 26, that is, an approximately 180° symmetrical with respect to the X-axis, in a plan view from a direction toward the inclined surface 21.

Since the resonator element 10*b* having such a mesa shape also includes the inclined surfaces 20 and 21 inclined at an angle θ of equal to or greater than 52° and equal to or less than 62° to the first side surface 14 and the second side surface 15 configuring the substrate 11*b* and intersecting the first side surface 14 and the second side surface 15, it is possible to obtain the same effect as that of the resonator element 10 according to the above-described first embodiment.

The substrates 11 and 11*b* using the quartz crystal are not limited to the AT-cut quartz crystal substrate having a cutting angle θ of approximately 35 ° 15' as described in the above-described embodiment, and other quartz crystal substrates such as SC cut and BT cut which excite similar thickness shear vibration can be widely applied to the substrates 11 and 11*b*.

Resonator

Figure 10:
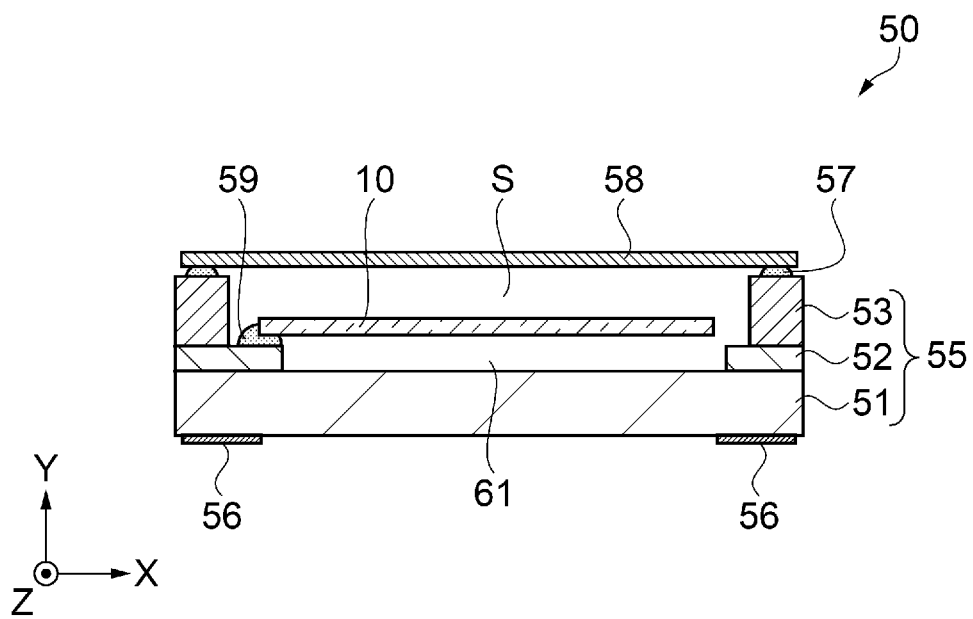
FIG. 10 is a sectional view illustrating an outline of a resonator.

Next, with reference to FIG. 10, an embodiment of a resonator will be described. FIG. 10 is a sectional view illustrating an outline of the resonator. In the embodiment of the resonator, it is possible to use any one of the above-described resonator elements 10, 10*a*, and 10*b*, but in the following description, an example to which the resonator element 10 described in the first embodiment is applied, will be described.

As illustrated in FIG. 10, a resonator 50 includes the resonator element 10 described in the above-described first embodiment, a package 55 including a concave portion 61 for housing the resonator element 10, and a lid 58 as a lid for forming an internal space (storage space) S between the lid 58 and the package 55. Hereinafter, the package 55 and the lid 58 as the lid will be sequentially described in detail.

In FIG. 10, for convenience of explanation, as three axes orthogonal to each other, the X axis, the Y axis, and the Z axis are illustrated, a direction parallel to the X axis is referred to as the "X-axis direction", a direction parallel to the Y axis is referred to as the "Y-axis direction", and a direction parallel to the Z axis is referred to as the "Z-axis direction". In addition, a +Y axis side is referred to as "upper" or "upward" and a −Y-axis side is referred to as "lower" or "downward".

The package 55 includes a plate shape bottom plate 51 having an approximately rectangular shape, a frame shape first frame plate 52 provided on the peripheral edge of the upper surface (surface toward Y-axis direction) of the bottom plate 51, and a frame shape side wall 53 provided on the peripheral edge of the upper side of the first frame plate 52. On the upper surface of the side wall 53, a seam ring 57 used as a bonding material for bonding the lid 58 as the lid (which will be described below) is provided. Accordingly, the package 55 accommodates the resonator element 10.

The package 55 includes the concave portion 61 (internal space S) of which the upper surface is open. An opening of the concave portion 61 is closed by the lid 58 as the lid bonded to the side wall 53 via the seam ring 57 as the bonding material. Accordingly, the internal space S sealed by closing the opening of the concave portion 61 of the package 55 is formed by this lid 58. The internal pressure of the sealed internal space S can be set by a desired atmospheric pressure. For example, the internal space S is filled with nitrogen gas to obtain atmospheric pressure, or the atmosphere is filled with gas of vacuum (state of space filled with gas of pressure lower than normal atmospheric pressure ($1\times10^5$ Pa to $1\times10^{-1\circ}$ Pa or less (JISZ8126-1: 1999))) such that it is possible to more stably continue the resonance of the resonator element 10. The internal space S of the present embodiment is set to the above-described vacuum state.

The first frame plate 52 bonded to the upper side of the bottom plate 51 has an approximately the rectangular shape with an opening at the center. The side wall 53 bonded to the upper side of the frame shape first frame plate 52 has an opening end outside an opening of the first frame plate 52 in the X-axis direction, and is provided in an approximately rectangular frame shape along the outer peripheral edge (upper surface rim portion) of the package 55 in which the bottom plate 51 and the first frame plate 52 are laminated. In other words, the side wall 53 has an opening shape that is open on the upper surface of the concave portion 61 and has a circumferential shape of an approximately rectangular shape. For example, on the upper surface of the frame shape side wall 53, the seam ring 57 formed of an alloy such as Kovar, is provided. The seam ring 57 has a function as the bonding material of the lid 58 as the lid and the side wall 53, and is provided in a frame shape (circumferential shape of approximately rectangular shape) along the upper surface along the side wall 53.

The package 55 is formed of a material having a coefficient of thermal expansion equal to or as close as possible to the thermal expansion coefficient of the resonator element 10 and the lid 58, and uses ceramic in this example. The package 55 is formed by laminating and sintering a green sheet molded into a predetermined shape. For example, the green sheet is a sheet in which a kneaded product produced by dispersing ceramic powder in a predetermined solution and adding a binder, is formed into a sheet shape.

On the upper surface of the first frame plate 52 exposed in an opening of the side wall 53, pad electrodes (not illustrated) are provided. For example, the pad electrode is formed by using a conductive paste such as silver and palladium, or tungsten metallization, forming a required shape, and baking and then plating using nickel, gold, silver, or the like. The pad electrode is installed to be connected to the external connection electrode 18 of the resonator element 10 (see FIG. 1). For example, the external connection electrode 18 of the resonator element 10 (see FIG. 1) is connected to the pad electrode by a bonding material 59 such as conductive adhesive such that the resonator element 10 is held in the internal space S. The number of the pad electrodes may be provided as necessary, and is not limited thereto. In addition, some of the pad electrodes are electrically connected to an external connection terminal 56 formed on an outer bottom portion of the package 55. With this configuration, it is possible to electrically connect the first electrode 16 and the second electrode 17 which resonate an external of the package 55 and the resonator element 10.

The lid 58 as the lid is a plate shape member, closes the opening of the concave portion 61 that is open on the upper surface of the package 55, and forms the internal space S. The lid 58 bonds the periphery of the opening of the concave portion 61 corresponding to the side wall 53 by using, for example, a seam welding method or the like. Since the lid 58 of this example is a plate shape, it is easy to form, and furthermore, it is excellent in shape stability. In addition, in the lid 58 of this example, a Kovar plate material having conductivity is used.

By using a Kovar plate in the lid 58, since the seam ring 57 and the lid 58 formed of Kovar at the time of sealing are melted in same molten state and are easily alloyed, the sealing can be easily and reliably performed. In addition, by using a plate material having conductivity for the lid 58, the lid 58 can be brought to a fixed potential, and a shielding effect can be obtained in the lid 58. With this configuration, it is possible to prevent electric noises entering from a lid 58 side. For the lid 58, a plate material of another material may be used in place of Kovar, for example, a metal material such as 42 alloy and stainless steel, the same material as the side wall 53 of the package 55, or the like can be used.

According to the resonator 50 of such a configuration, the resonator element 10 described in the above-described embodiment is accommodated in the internal space S configured with the package 55 and the lid 58. Therefore, since it is possible to enhance the reliability by reducing occurrence of disconnection of the first lead electrode 26 and the second lead electrode 29 of the resonator element 10, it is possible to reduce the influence on the resonance characteristics of the first lead electrode 26 and the second lead electrode 29 by the resonance confinement effect according to the installation on the inclined surfaces 20 and 21 of the resonator element 10, and it is possible to provide the resonator 50 which can realize the improvement of the resonance characteristics such as the Q value and the CI value (crystal impedance).

Oscillator

Figure 11:
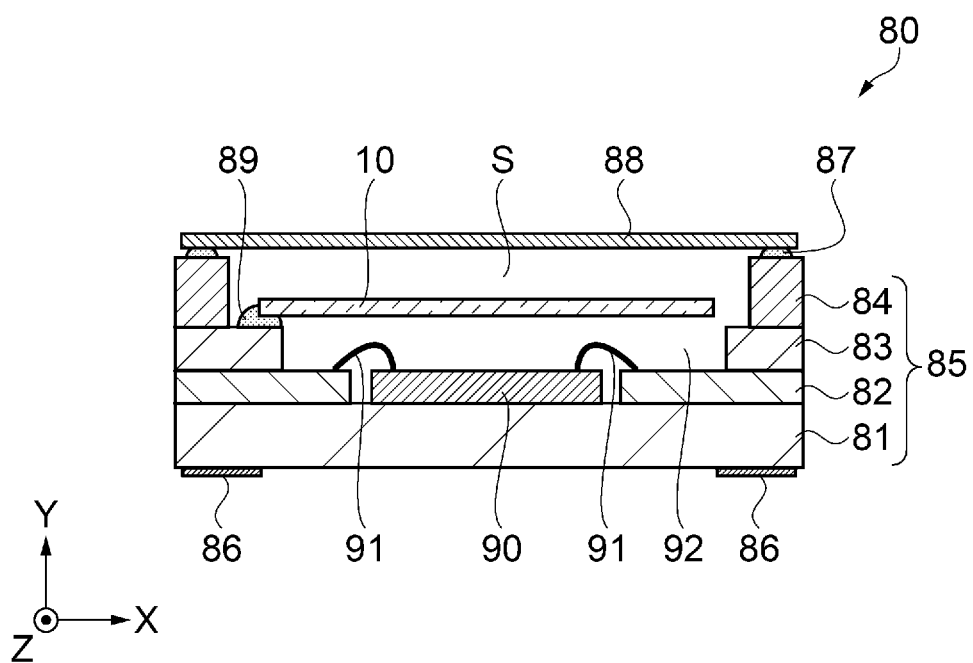
FIG. 11 is a sectional view illustrating an outline of an oscillator.

Next, with reference to FIG. 11, an embodiment of an oscillator will be described. FIG. 11 is a sectional view illustrating an outline of the oscillator. In the embodiment of the oscillator, it is possible to use one of the above-described resonator elements 10, 10a, and 10b, and in the following descriptions, an example to which the resonator element 10 described in the first embodiment is applied, will be described.

As illustrated in FIG. 11, an oscillator 80 includes the resonator element 10 described in the above-described first embodiment, a circuit element 90 including an electric circuit for driving the resonator element 10, a package 85 including a concave portion 92 for accommodating the resonator element 10 and the circuit element 90, and a lid 88 as the lid for forming the internal space (storage space) S between the package 85 and the lid 88. Hereinafter, the package 85, the circuit element 90, and the lid 88 as the lid will be sequentially described in detail.

In FIG. 11, for convenience of explanation, as three axes orthogonal to each other, the X axis, the Y axis, and the Z axis are illustrated, the direction parallel to the X axis is referred to as the "X-axis direction", the direction parallel to the Y axis is referred to as the "Y-axis direction", and the direction parallel to the Z axis is referred to as the "Z-axis direction". In addition, the +Y axis side is referred to as the "upper" or the "upward" and the −Y-axis side is referred to as the "lower" or the "downward".

The package 85 includes a plate shape bottom plate 81 having the approximately rectangular shape, a frame-shaped first frame plate 82 provided on the peripheral edge of the upper surface (surface toward Y-axis direction) of the bottom plate 81, a frame-shaped second frame plate 83 provided on the peripheral edge of the upper surface of the first frame plate 82, and a frame shape side wall 84 provided on the peripheral edge of the upper surface of the second frame plate 83. On the upper surface of the side wall 84, a seam ring 87 used as the bonding material for bonding a lid 88 as a lid (which will be described below) is provided. Accordingly, the package 85 accommodates the resonator element 10, the circuit element 90, or the like.

The package 85 includes the concave portion 92 (internal space S) of which the upper surface is open. An opening of the concave portion 92 is closed by the lid 88 as the lid bonded to the side wall 84 via the seam ring 87 as the bonding material. Accordingly, the internal space S sealed by closing the opening of the concave portion 92 of the package 85 is formed by this lid 88. The internal pressure of the sealed internal space S can be set by a desired atmospheric pressure. For example, the internal space S is filled with nitrogen ($N_2$) gas to obtain the atmospheric pressure, or the atmosphere is filled with gas of vacuum (state of space filled with gas of pressure lower than normal atmospheric pressure ($1 \times 10^5$ Pa to $1 \times 10^{-10}$ Pa or less (JIS Z 8126-1: 1999))) such that it is possible to more stably continue the resonance of the resonator element 10. The internal space S of the present embodiment is set to the above-described vacuum state. In addition, although it is preferable that the internal space S using the oscillator 80 of the present embodiment is sealed by closing the opening of the concave portion 92 of the package 85, the internal space S is filled with the nitrogen gas to obtain the atmospheric pressure, or the atmosphere is filled with gas of vacuum (state of space filled with gas of pressure lower than normal atmospheric pressure ($1 \times 10^5$ Pa to $1 \times 10^{-10}$ Pa or less)), this is not limited to a case with the oscillator of other configurations. For example, in other configurations, it may have a configuration filled with the nitrogen ($N_2$) gas or a structure that is released to the atmosphere.

The first frame plate 82 bonded to the upper surface of the bottom plate 81 has a frame shape with an opening at the center. The second frame plate 83 bonded to the upper surface of the frame-shaped first frame plate 82 has a frame shape having an opening end outside (bidirectional) an opening of the first frame plate 82 in the X-axis direction.

The side wall 84 bonded to the upper surface of the frame-shaped second frame plate 83 has an opening end outside an opening of the second frame plate 83 in the X axis and the Y axis directions, and is provided in a frame shape of an approximately rectangular shape along the outer peripheral edge (upper surface rim portion) of the package 85 on which the second frame plate 83 is laminated from the bottom plate 81. In other words, the side wall 84 has a circumferential shape in which an opening shape of the concave portion 92 of which the upper surface is open, is an approximately rectangular shape. On the upper surface of the side wall 84 of the frame shape, for example, the seam ring 87 formed of the alloy such as Kovar is provided. The seam ring 87 has the function as the bonding material of the lid 88 as the lid and the side wall 84, and is provided in the frame shape (circumferential shape of approximately rectangular shape) along the upper surface of the side wall 84.

The package 85 is formed of a material having the coefficient of thermal expansion equal to or as close as possible to the thermal expansion coefficient of the resonator element 10, the circuit element 90, and the lid 88, and uses the ceramic in this example. The package 85 is formed by laminating and sintering the green sheet molded into a predetermined shape. For example, the green sheet is a sheet in which the kneaded product produced by dispersing ceramic powder in a predetermined solution and adding the binder, and is formed into the sheet shape.

On the upper surface of the first frame plate 82 exposed on the opening of the second frame plate 83, a plurality of pad electrodes (not illustrated) are provided. In addition, on the upper surface of the second frame plate 83 exposed on an opening of the side wall 84, the plurality of pad electrodes (not illustrated) are provided. For example, the pad electrode is formed by using a conductive paste such as silver and palladium, or tungsten metallization, forming a required shape, and baking and then plating using nickel, gold, silver, or the like. The plurality of pad electrodes installed on the upper surface of the first frame plate 82 are installed to be electrically connected to the circuit element 90.

In addition, the plurality of pad electrodes provided on the upper surface of the second frame plate 83 are connection electrode installed to be connected to the resonator element 10 (which will be described below). For example, the external connection electrode 18 of the resonator element 10 (see FIG. 1) is connected to the pad electrode by a bonding material 89 such as the conductive adhesive such that the resonator element 10 is held in the internal space S. In addition, the plurality of pad electrodes provided on the upper surface of the second frame plate 83 are electrically connected to any one of the pad electrodes (not illustrated) provided on the upper surface of the second frame plate 83.

The number of the pad electrodes may be provided as necessary, and is not limited thereto. In addition, some of the pad electrodes electrically connected to the circuit element 90 are electrically connected to an external connection terminal 86 formed on an outer bottom portion of the package 85. With this configuration, it is possible to electrically connect an external of the package 85, the circuit element 90, and the like.

The circuit element 90 is connected on the upper surface of the bottom plate 81 by, for example, the conductive adhesive (not illustrated) or the like. For example, the circuit element 90 includes the electric circuit for driving the resonator element 10. A bonding pad (not illustrated) is provided on an active surface of the circuit element 90 and the bonding pad is connected to the pad electrode (not illustrated) provided on the upper surface of the first frame plate 82 exposed on the opening of the second frame plate 83 by electric conduction using a metal wire (bonding wire) 91.

The lid 88 as the lid is the plate shape member, closes the opening of the concave portion 92 that is open on the upper surface of the package 85, and forms the internal space S. The lid 88 bonds the periphery of the opening of the concave portion 92 corresponding to the upper surface of the side wall 84 by using, for example, the seam welding method or the like. Since the lid 88 of this example is the plate shape, it is easy to form, and furthermore, it is excellent in the shape stability. In addition, in the lid 88 of this example, the Kovar plate material having the conductivity is used.

By using the Kovar plate in the lid 88, since the seam ring 87 and the lid 88 formed of Kovar at the time of sealing are melted in same molten state and are easily alloyed, the sealing can be easily and reliably performed. In addition, by using the plate material having the conductivity for the lid 88, the lid 88 can be brought to the fixed potential, and the shielding effect can be obtained in the lid 88. With this configuration, it is possible to prevent the electric noises entering from a lid 88 side. For the lid 88, the plate material of another material may be used in place of Kovar, for example, the metal material such as 42 alloy and stainless steel, the same material as the side wall 84 of the package 85, or the like can be used.

According to the oscillator 80 of such a configuration, the circuit element 90 including the electric circuit for driving the resonator element 10 and the resonator element 10 described in the above-described embodiment is accommodated in the internal space S configured with the package 85 and the lid 88. With this configuration, since it is possible to enhance the reliability by reducing occurrence of disconnection of the first lead electrode 26 and the second lead electrode 29 of the resonator element 10, it is possible to reduce the influence on the resonance characteristics of the first lead electrode 26 and the second lead electrode 29 by the resonance confinement effect according to the installation on the inclined surfaces 20 and 21 of the resonator element 10, and it is possible to provide the oscillator 80 which can realize the improvement of the resonance characteristics such as the Q value and the CI value (crystal impedance).

Electronic Device

Next, an electronic device using any one of the resonator elements 10, 10a, and 10b will be described in detail based on FIG. 12 to FIG. 14. In the following description, an application example of the resonator element 10 will be described.

First, with reference to FIG. 12, a mobile type personal computer that is an example of the electronic device, will be described. FIG. 12 is a perspective view schematically illustrating a configuration of the mobile type personal computer that is the example of the electronic device.

In this figure, a personal computer 1100 is configured with a main body unit 1104 including a keyboard 1102 and a display unit 1106 including a display 1108, the display unit 1106 is rotatably supported via a hinge structure with respect to the main body unit 1104. In such a personal computer 1100, the resonator element 10 is built in, and a controller 1110 can perform a control such as driving control based on a resonance signal of the resonator element 10.

Figure 13:
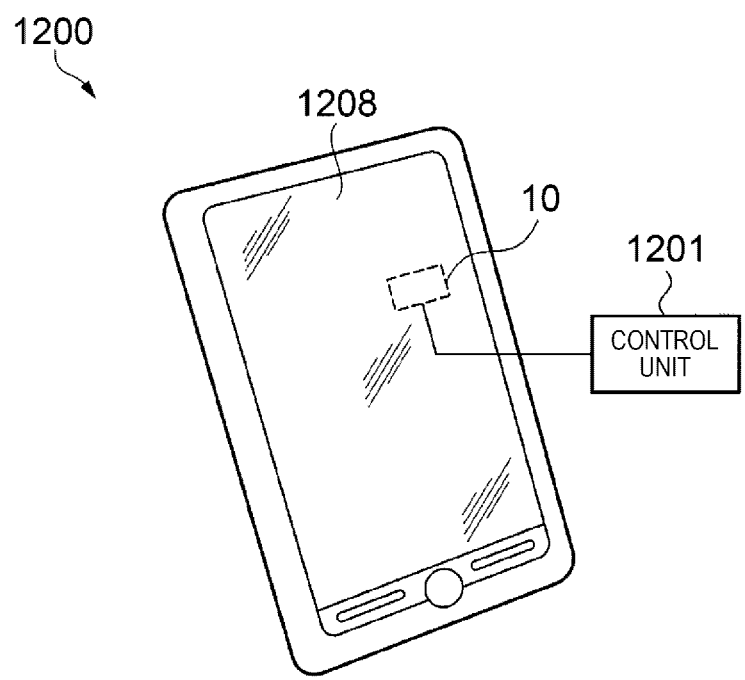
FIG. 13 is a perspective view schematically illustrating a configuration of a smartphone (mobile phone) which is an example of the electronic device.

FIG. 13 is a perspective view schematically illustrating a configuration of a smartphone (mobile phone) that is an example of the electronic device.

In this figure, a smartphone 1200 incorporates the above-described resonator element 10. Accordingly, the resonance signal of the resonator element 10 is transmitted to a controller 1201 of the smartphone 1200. The controller 1201 is configured by including a central processing unit (CPU), it is possible to change a display image to be displayed on a display unit 1208 or to sound an alarm sound or sound effect, by recognizing posture and behavior of the smartphone 1200 from received detection data, and it is possible to cause a main body to be resonated by driving a resonance motor. In other words, it is possible to perform motion sensing of the smartphone 1200, and it is possible to change display content from the posture and the behavior measured or it is possible to cause the sound, the resonance, and the like to be generated. Particularly, when performing an application of a game, it is possible to enjoy realistic feeling close to reality.

Figure 14:
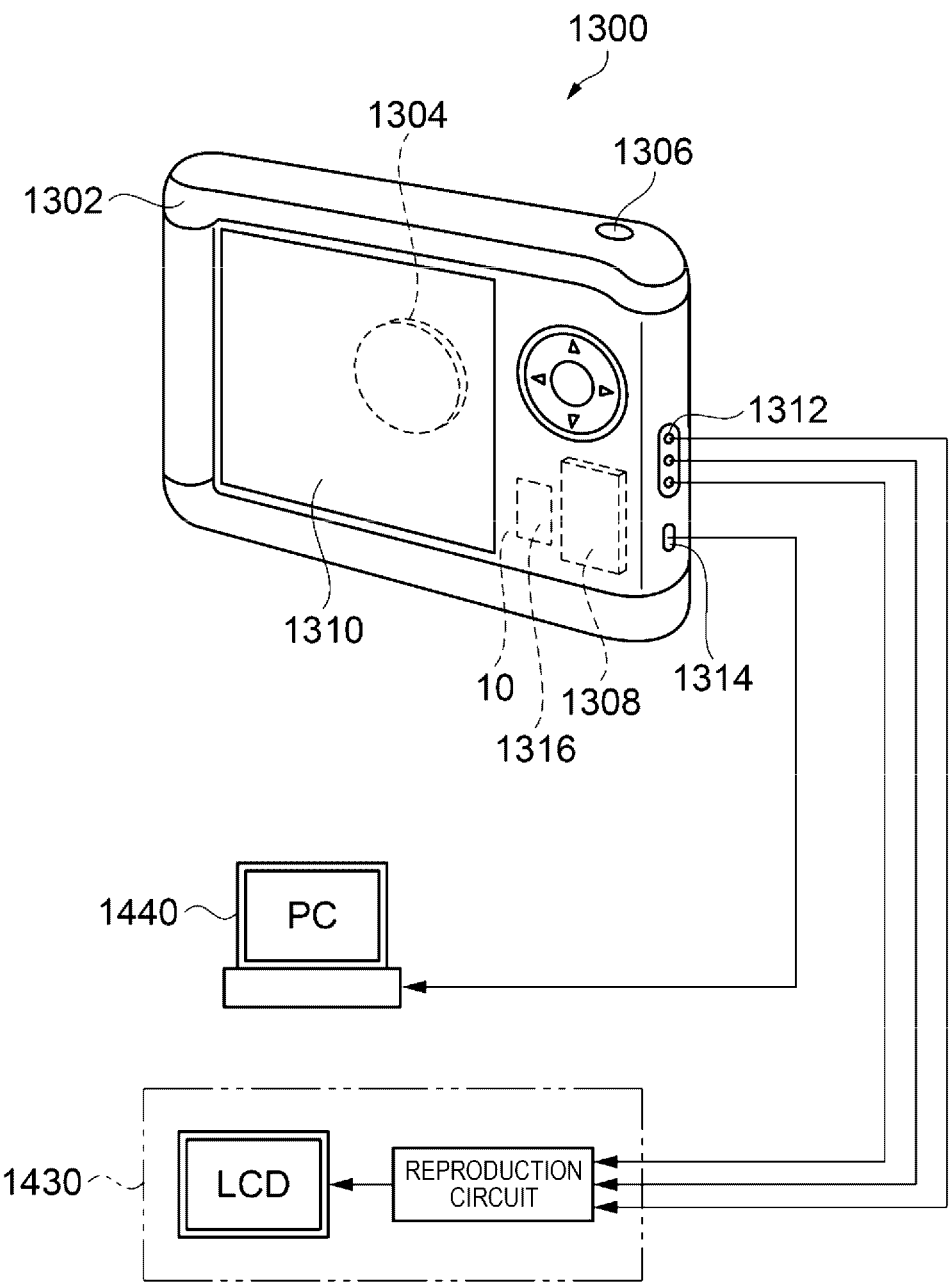
FIG. 14 is a perspective view illustrating a configuration of a digital still camera which is an example of the electronic device.

FIG. 14 is a perspective view illustrating a configuration of a digital still camera that is an example of the electronic device. In this figure, connections with external devices are also shown briefly.

In this figure, a display unit 1310 is provided on the rear surface of a case (body) 1302 of a digital still camera 1300, and is configured to perform display based on imaging signals from a CCD, and the display unit 1310 also functions as a finder for displaying a subject as an electronic image. In addition, a light receiving unit 1304 including an optical lens (imaging optical system), the CCD, or the like is provided on the front side (rear side in figure) of the case 1302.

When a photographer confirms a subject image displayed on the display unit 1310 and presses a shutter button 1306, the imaging signal of the CCD at that time is transferred to and stored in a memory 1308. In addition, in this digital still camera 1300, a video signal output terminal 1312 and an input and output terminal 1314 for data communication are provided on a side surface of a case 1302. Accordingly, as illustrated in the figure, a TV monitor 1430 is connected to the video signal output terminal 1312 and a personal computer 1440 is connected to the input and output terminal 1314 for data communication as necessary. Furthermore, a configuration in which the imaging signal stored in a memory 1308 is output to the TV monitor 1430 and the personal computer 1440 by a predetermined operation, is adapted. In such a digital still camera 300, the resonator element 10 is built in and a controller 1316 can perform a control such as image capturing based on the resonance signal of the resonator element 10.

Since such an electronic device includes the resonator element 10 and the controllers 1110, 1201, and 1316, and has excellent reliability.

Figure 12:
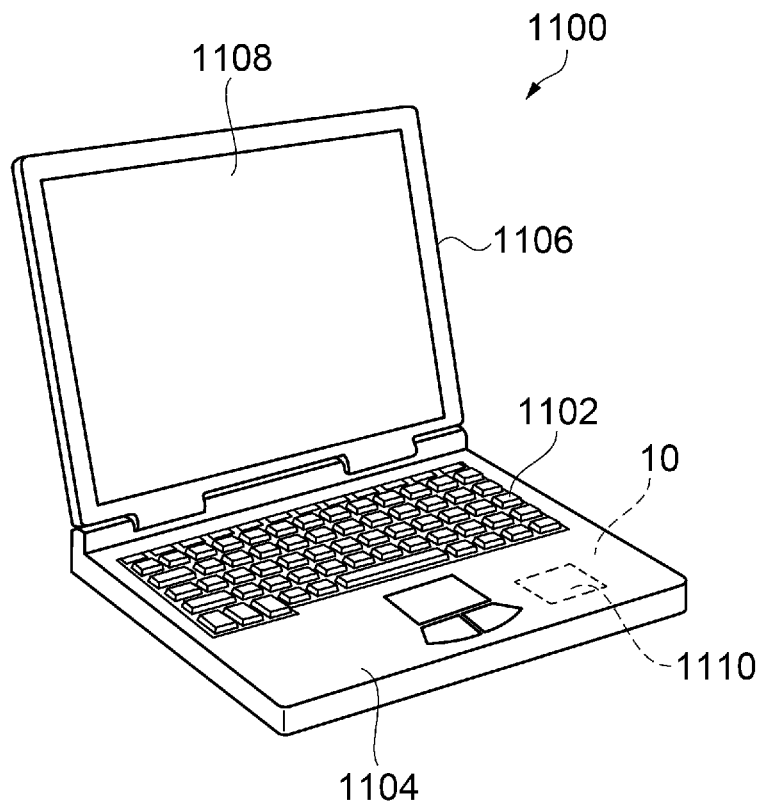
FIG. 12 is a perspective view schematically illustrating a configuration of a mobile personal computer which is an example of an electronic device.

For example, the electronic device including the resonator element 10 can be applied to a tablet terminal, a clock, an ink jet type discharging device (for example, ink jet printer), a laptop type personal computer, a television, a video camera, a video tape recorder, a car navigation device, a pager, an electronic notebook (including communication function), an electronic dictionary, an electronic calculator, an electronic game machine, a word processor, a workstation, a videophone, a security monitor for television, an electronic binocular, a POS terminal, medical equipment (for example, electronic clinical thermometer, blood pressure monitor, blood glucose meter, electrocardiogram measuring device, ultrasonic diagnostic device, and electronic endoscope), a fish finder, various measuring instruments, instruments (for example, instruments of vehicle, aircraft, and ship), a flight simulator, a seismograph, a pedometer, an inclinometer, a vibrometer that measures vibration of a hard disk, a posture control device of a flying object such as a robot and a drone, control equipment used in inertial navigation for automatic operation of automobiles, and the like, in addition to the personal computer of FIG. 12, the smartphone (mobile phone) of FIG. 13, and the digital still camera of FIG. 13.

Vehicle

Figure 15:
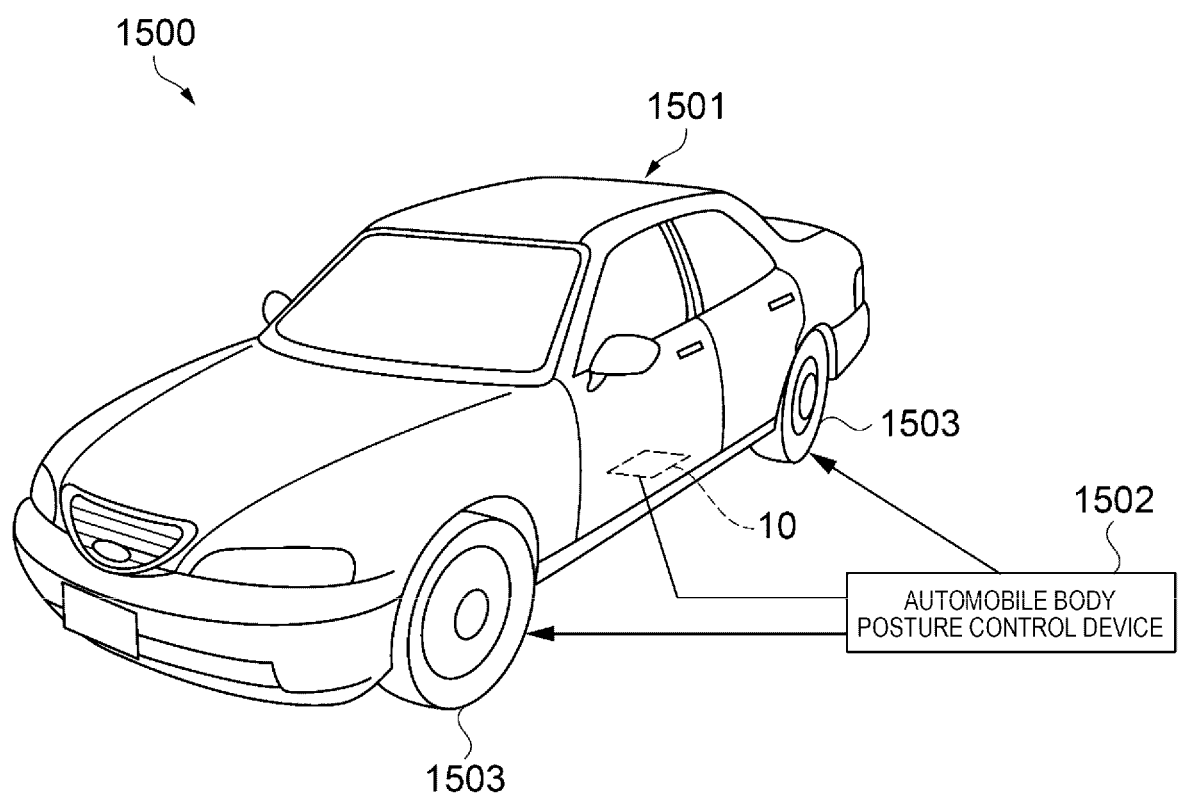
FIG. 15 is a perspective view illustrating a configuration of an automobile which is an example of a vehicle.

Next, a vehicle using the resonator element 10 illustrated in FIG. 15 will be described in detail. FIG. 15 is a perspective view illustrating a configuration of an automobile that is an example of the vehicle. In the following description, an application example of the resonator element 10 will be described.

As illustrated in FIG. 15, the resonator element 10 is built in an automobile 1500, and, for example, it is possible to control the posture of an automobile vehicle body 1501 by the resonance signal of the resonator element 10 as a reference signal. The resonance signal of the resonator element 10 is provided to an automobile body posture control device 1502 for controlling posture of the automobile body as a controller, and the automobile body posture control device 1502 can control the stiffness of suspension by the signal as the reference signal, or control braking of each wheel 1503. In addition, the resonator element 10 can be widely applied to an electronic control unit (ECU) such as a keyless entry system, an immobilizer, a car navigation system, a car air conditioner, an anti-lock braking system (ABS), an airbag, a tire pressure monitoring system (TPMS), an engine control system (engine system), a control device of inertial navigation for automatic operation, a battery monitor of a hybrid vehicle, and an electric vehicle.

In addition, besides the above-described examples, the resonator element 10 applied to the vehicle is a controller of a biped walking robot, a train, and the like, and can be used in a remote control device such as a radio control plane, a radio control helicopter, and a drone, a controller of an autonomous flying body control section, a controller of an agricultural machine and a construction machine, and drive control of a rocket, an artificial satellite, a ship, an automatic guided vehicle (AGV), and a bipedal walking robot, and the like. As described above, in realizing drive control including posture control or the like of various vehicles, the resonator element 10 and respective controllers (not illustrated) are incorporated.

Since a vehicle includes the resonator element 10 and controller (for example, automobile body posture control device 1502 as a posture controller), the vehicle has excellent reliability.

So far, although the resonator element, the resonator, the oscillator, the electronic device, and the vehicle are described based on the illustrated embodiments, the invention is not limited thereto, and a configuration of each unit can be replaced with an arbitrary configuration having the same function. In addition, other arbitrary structure may be added to the invention.

Hereinafter, an aspect in accordance with the contents derived from the above-described embodiments will be described.

Aspect 1

The resonator element according to the present aspect includes a substrate that includes a resonance portion for exciting thickness shear vibration as main resonance, a first electrode that is installed on the resonance portion of one of main surfaces, in both of the main surfaces positioned on front and rear surfaces of the substrate, and a second electrode that is installed on the resonance portion of the other of the main surfaces, in which an outer shape of the substrate in a plan view includes a first side surface and a second side surface that extend in a first direction along a direction of the thickness shear vibration, are arranged in a second direction intersecting the first direction, and are respectively connected to the both main surfaces, the first side surface and the second side surface respectivley include an inclined surface inclined with respect to the main surface of the substrate, a first lead electrode connected to the first electrode is installed on the inclined surface of the first side surface, a second lead electrode connected to the second electrode is installed on the inclined surface of the second side surface, and an angle formed between the inclined surface and the main surface is equal to or greater than 52° and equal to or less than 62°.

According to the present aspect, an inclined surface inclined at an angle of equal to or greater than 52° and equal to or less than 62° with respect to the main surface on the first side surface and the second side surface connecting both main surfaces, is provided. Accordingly, the first lead electrode led out from the first electrode provided on one of main surfaces, is provided on the inclined surface of the first side surface and the second lead electrode led out from the second electrode provided on the other of main surfaces, is provided on the inclined surface of the second side surface. Since each inclined surface is inclined at the angle of equal to or greater than 52° and equal to or less than 62° with respect to the main surface, and the intersecting corner portion between the inclined surface and the main surface is an obtuse angle, it is possible to hardly cause damage on the first lead electrode and the second lead electrode passing through this corner portion. Therefore, it is possible to hardly cause disconnection of the first lead electrode and the second lead electrode.

In addition, according to the present aspect, by providing each of the first side surface and the second side surface with the inclined surface inclined at the angle of equal to or greater than 52° and equal to or less than 62° with respect to the main surface, it is possible to enhance the resonance confinement effect on a side surface side, it is possible to reduce the influence on the resonance characteristics according to the installation the first lead electrode and the second lead electrode, and it is possible to improve the resonance characteristics such as the Q value and the CI value (crystal impedance).

Aspect 2

In the resonator element according to the aspect, it is preferable that the first lead electrode includes a first portion installed from the first electrode toward the inclined surface and a second portion installed on the inclined surface, and the second portion satisfies a relationship of w2>w1 when a width of a portion installed on the main surface is w1 and a width of a portion installed on the inclined surface is w2.

According to the present aspect, since the width w1 of the portion of the first lead electrode installed on the main surface is smaller than width w2 of the second portion installed on the inclined surface, it is possible to reduce the influence on the resonance characteristics due to the first lead electrode.

Aspect 3

In the resonator element described in the aspect, it is preferable that the second lead electrode includes a first portion installed from the second electrode toward the inclined surface and a second portion installed on the inclined surface, and the second portion satisfies a relationship of w4>w3 when a width of the portion installed on the main surface is w3 and a width of the portion installed on the inclined surface is w4.

According to the present aspect, since the width w3 of the portion of the second lead electrode installed on the main surface is smaller than width w4 of the second portion installed on the inclined surface, it is possible to reduce the influence on the resonance characteristics due to the second lead electrode.

Aspect 4

In the resonator element described in the aspect, it is preferable that the second portion of the first lead electrode and the second portion of the second lead electrode are installed on only the inclined surface.

According to the present aspect, since the second portion of the first lead electrode and the second lead electrode is provided only on the inclined surface exhibiting the resonance confinement effect, it is possible to further reduce the influence on the resonance characteristics due to the first lead electrode and the second lead electrode.

Aspect 5

A resonator according to the present aspect includes the resonator element according to any one of the aspect 1 to the aspect 4, a package that has a concave portion and in which the resonator element is accommodated in the concave portion, and a lid that seals the concave portion.

According to the present aspect, since the above-described resonator element is accommodated in the package, it is possible to enhance the reliability by reducing the occurrence of the disconnection of the first lead electrode and the second lead electrode of the resonator element, it is possible to reduce the influence on the resonance characteristics due to the first lead electrode and the second lead electrode by the resonance confinement effect according to the installation on the inclined surface of the resonator element, and it is possible to provide the resonator which can realize the improvement of the resonance characteristics such as the Q value and the CI value (crystal impedance).

Aspect 6

An oscillator according to the present aspect includes the resonator element according to any one of the aspect 1 to the aspect 4, a circuit element that includes an electric circuit for driving the resonator element, a package that has a concave portion and in which the resonator element and the circuit element are accommodated in the concave portion, and a lid that seals the concave portion.

According to the present aspect, since the resonator element and the circuit element, described above, are accommodated in the package, it is possible to enhance the reliability by reducing the occurrence of the disconnection of the first lead electrode and the second lead electrode of the resonator element, it is possible to reduce the influence on the resonance characteristics of the first lead electrode and the second lead electrode by the resonance confinement effect according to the installation on the inclined surface of the resonator element, and it is possible to provide the oscillator which can realize the improvement of the resonance characteristics such as the Q value and the CI value (crystal impedance).

Aspect 7

An electronic device according to the present aspect includes the resonator element according to any one of the aspect 1 to the aspect 4, and a controller that performs a control based on a resonance signal of the resonator element.

According to the present aspect, since the controller performs the control based on the resonance signal of the above-described resonator element, it is possible to obtain the effect of the above-described resonator element, and it is possible to obtain the electronic device with high reliability.

Aspect 8

A vehicle according to the present aspect includes the resonator element according to any one of the aspect 1 to the aspect 4, and a controller that performs a control based on a resonance signal of the resonator element.

According to the present aspect, since the controller performs the control based on the resonance signal of the above-described resonator element, it is possible to obtain the effect of the above-described resonator element, and it is possible to obtain the vehicle with high reliability.

The entire disclosure of Japanese Patent Application No. 2018-027634, filed Feb. 20, 2018 is expressly incorporated by reference herein.

What is claimed is:

1. A resonator element comprising:
a substrate including main surfaces on front and rear sides of the substrate, respectively, each of the main surfaces having a resonance portion that excites thickness shear vibration as main resonance;
a first electrode that is installed on the resonance portion of one of the main surfaces; and
a second electrode that is installed on the resonance portion of the other of the main surfaces,
wherein an outer shape of the substrate in a plan view includes a first side surface and a second side surface that (i) extend in a first direction along a direction of the thickness shear vibration, (ii) are arranged in a second direction intersecting the first direction, and (iii) are respectively connected to the both of the main surfaces,
the first side surface and the second side surface each include an inclined surface inclined with respect to the main surfaces of the substrate,
a first lead electrode connected to the first electrode is installed on the inclined surface of the first side surface,
a second lead electrode connected to the second electrode is installed on the inclined surface of the second side surface,
an angle formed between each of the inclined surfaces and a said main surface is equal to or greater than 52° and equal to or less than 62°,
the length of the substrate is greatest along the first direction, and
the first lead electrode and the second lead electrode respectively extend from the first electrode and the second electrode in the second direction perpendicular to the first direction.

2. The resonator element according to claim 1,
wherein the first lead electrode includes a first portion installed from the first electrode toward the inclined surface of the first side surface and a second portion installed on the inclined surface of the first side surface, and
the second portion of the first lead electrode satisfies a relationship of w2 >w1 when a width of a portion of the first lead electrode installed on the one main surface is w1 and a width of a portion of the first lead electrode installed on the inclined surface of the first side surface is w2.

3. The resonator element according to claim 2,
wherein the second lead electrode includes a first portion installed from the second electrode toward the inclined surface of the second side surface and a second portion installed on the inclined surface of the second side surface, and
the second portion of the second lead electrode satisfies a relationship of w4 >w3 when a width of a portion of the second lead electrode installed on the other main surface is w3 and a width of a portion of the second lead electrode installed on the inclined surface of the second side surface is w4.

4. The resonator element according to claim 3,
wherein the second portion of the first lead electrode and the second portion of the second lead electrode are installed on only the respective inclined surfaces.

5. A resonator comprising:
the resonator element according to claim 1;
a package that has a concave portion and in which the resonator element is accommodated in the concave portion, and
a lid that seals the concave portion.

6. A resonator comprising:
the resonator element according to claim 2;
a package that has a concave portion and in which the resonator element is accommodated in the concave portion, and
a lid that seals the concave portion.

7. A resonator comprising:
the resonator element according to claim 3;
a package that has a concave portion and in which the resonator element is accommodated in the concave portion, and
a lid that seals the concave portion.

8. A resonator comprising:
the resonator element according to claim 4;

a package that has a concave portion and in which the resonator element is accommodated in the concave portion, and a lid that seals the concave portion.

9. An oscillator comprising:

the resonator element according to claim 1;

a circuit element that includes an electric circuit for driving the resonator element;

a package that has a concave portion and in which the resonator element and the circuit element are accommodated in the concave portion; and a lid that seals the concave portion.

10. An oscillator comprising:

the resonator element according to claim 2;

a circuit element that includes an electric circuit for driving the resonator element;

a package that has a concave portion and in which the resonator element and the circuit element are accommodated in the concave portion; and a lid that seals the concave portion.

11. An oscillator comprising:

the resonator element according to claim 3;

a circuit element that includes an electric circuit for driving the resonator element;

a package that has a concave portion and in which the resonator element and the circuit element are accommodated in the concave portion; and a lid that seals the concave portion.

12. An oscillator comprising:

the resonator element according to claim 4;

a circuit element that includes an electric circuit for driving the resonator element;

a package that has a concave portion and in which the resonator element and the circuit element are accommodated in the concave portion; and a lid that seals the concave portion.

13. An electronic device comprising:

the resonator element according to claim 1; and a controller that performs a control based on a resonance signal of the resonator element.

14. A vehicle comprising:

the resonator element according to claim 1; and a controller that performs a control based on a resonance signal of the resonator element.

* * * * *